US012628635B2

(12) United States Patent
Smith et al.

(10) Patent No.: US 12,628,635 B2
(45) Date of Patent: May 12, 2026

(54) SELECTIVE DEPOSITION OF LINER AND BARRIER FILMS FOR RESISTANCE REDUCTION OF SEMICONDUCTOR DEVICES

(71) Applicant: Tokyo Electron Limited, Tokyo (JP)

(72) Inventors: Jeffrey Smith, Clifton Park, NY (US); Hiroaki Niimi, Cohoes, NY (US); Kandabara Tapily, Mechanicville, NY (US); Daniel Chanemougame, Niskayuna, NY (US); Lars Liebmann, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 562 days.

(21) Appl. No.: 17/882,821

(22) Filed: Aug. 8, 2022

(65) Prior Publication Data

US 2024/0047342 A1     Feb. 8, 2024

(51) Int. Cl.
H10W 20/00 (2026.01)
H10D 62/13 (2025.01)
(Continued)

(52) U.S. Cl.
CPC .......... H10W 20/42 (2026.01); H10D 62/151 (2025.01); H10W 10/014 (2026.01); H10W 10/17 (2026.01); H10W 20/033 (2026.01); H10W 20/057 (2026.01); H10W 20/0698 (2026.01); H10W 20/081 (2026.01)

(58) Field of Classification Search
CPC ......... H01L 21/28518; H01L 21/76224; H01L 21/76802; H01L 21/76843; H01L 21/76879; H01L 21/76895; H01L 21/76897; H01L 21/823871; H01L 23/5226; H01L 23/5286; H01L 23/535; H01L 27/092; H01L 29/0673;
(Continued)

(56) References Cited

U.S. PATENT DOCUMENTS 9,947,753 B2    4/2018  Hung et al.
10,714,576 B2   7/2020  Hung et al.
(Continued)

FOREIGN PATENT DOCUMENTS

KR     10-2021-0154681 A     12/2021

OTHER PUBLICATIONS

International Search Report & Written Opinion issued Oct. 23, 2023 in PCT/US2023/026905, 12 pages.

*Primary Examiner* — Duy T Nguyen
*Assistant Examiner* — Jiyoung Oh
(74) *Attorney, Agent, or Firm* — Oblon, McClelland, Maier & Neustadt, L.L.P.

(57) ABSTRACT

A semiconductor device includes a field-effect transistor (FET) having a source/drain (S/D) structure and an interconnect structure in contact with the S/D structure. The interconnect structure has a barrier film at a surface of the interconnect structure separating the interconnect structure from materials surrounding the interconnect structure. A first portion of the barrier film covers a first interface between the interconnect structure and the S/D structure. A second portion of the barrier film covers a second interface between the interconnect structure and dielectric materials adjacent to the interconnect structure. The first portion of the barrier film is thicker than the second portion of the barrier film.

8 Claims, 8 Drawing Sheets

(51) Int. Cl.
  *H10W 10/00* (2026.01)
  *H10W 10/17* (2026.01)
  *H10W 20/42* (2026.01)

(58) Field of Classification Search
  CPC ......... H01L 29/0847; H01L 2221/1063; H01L 21/823475
  USPC ......................................................... 257/754
  See application file for complete search history.

(56) References Cited

U.S. PATENT DOCUMENTS

| | | | |
|---|---|---|---|
| 11,264,274 | B2 | 3/2022 | Smith et al. |
| 11,322,401 | B2 | 5/2022 | Smith et al. |
| 11,515,165 | B2 | 11/2022 | Huang et al. |
| 11,670,690 | B2 | 6/2023 | Hung et al. |
| 11,742,247 | B2 | 8/2023 | Lin et al. |
| 2008/0048282 | A1 | 2/2008 | Han |
| 2015/0041896 | A1* | 2/2015 | Botula ............... H10D 30/0223 |
| | | | 257/344 |
| 2016/0336412 | A1 | 11/2016 | Hung et al. |
| 2017/0365555 | A1* | 12/2017 | Choi ...................... H10D 30/62 |
| 2018/0233565 | A1 | 8/2018 | Hung et al. |
| 2020/0343349 | A1 | 10/2020 | Hung et al. |
| 2021/0098294 | A1* | 4/2021 | Smith ................ H10D 84/0149 |
| 2021/0098306 | A1* | 4/2021 | Smith ................... H01L 21/743 |
| 2021/0391184 | A1 | 12/2021 | Huang et al. |
| 2021/0391438 | A1* | 12/2021 | Chiu ................ H01L 21/76877 |
| 2022/0020646 | A1 | 1/2022 | Lin et al. |
| 2022/0122892 | A1* | 4/2022 | Smith ................. H10D 84/038 |
| 2022/0123003 | A1* | 4/2022 | Young ................. H10B 43/50 |
| 2022/0367198 | A1 | 11/2022 | Huang et al. |
| 2023/0268402 | A1 | 8/2023 | Hung et al. |

* cited by examiner

SELECTIVE DEPOSITION OF LINER AND BARRIER FILMS FOR RESISTANCE REDUCTION OF SEMICONDUCTOR DEVICES

TECHNICAL FIELD

The present disclosure describes embodiments generally related to semiconductor devices and manufacturing processes.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Transistors, such as field-effect transistors (FETs), are the basic elements of microelectronics and integrated circuits. There has been a continuous drive to scale down or shrink transistors and other semiconductor devices to increase density and improve processing performance. Historically, transistors have been created in one plane, with wiring/metallization formed above the active device plane. Recently, three-dimensional (3D) fabrication has been developed to utilize the vertical axis to improve transistor density. For example, a new device architecture known as complementary FET (CFET) can include transistors that are stacked one over the other.

SUMMARY

Aspects of the disclosure provide a semiconductor device. The semiconductor device includes a field-effect transistor (FET) having a source/drain (S/D) structure and an interconnect structure in contact with the S/D structure. The interconnect structure has a barrier film at a surface of the interconnect structure separating the interconnect structure from materials surrounding the interconnect structure. A first portion of the barrier film covers a first interface between the interconnect structure and the S/D structure. A second portion of the barrier film covers a second interface between the interconnect structure and dielectric materials adjacent to the interconnect structure. The first portion of the barrier film is thicker than the second portion of the barrier film.

In an embodiment, the second portion of the barrier film covers a surface of a via structure of the interconnect structure. The via structure can connect the interconnect structure to a power rail. In some examples, the first portion of the barrier and the second portion of the barrier film are formed using the same material.

Aspects of the disclosure further provide a method of manufacturing a semiconductor device. The method can include forming a trench structure through dielectric materials to expose a S/D structure of a FET, selectively forming a first barrier film on a surface of a silicide layer of the exposed S/D structure to seal the exposed S/ID structure, conformally forming a second barrier film on an inner surface of the trench structure, the second barrier film overlapping the first barrier film, and filling a conductive material into the trench structure to form an interconnect structure for the S/ID structure.

In an example, the selectively forming the first barrier film can include performing a selective deposition process in which a deposition of the first barrier film on the surface of the silicide layer of the exposed S/D structure is selective to the dielectric materials surrounding the trench structure. In an example, the first barrier film is thicker than the second barrier film. In an example, the trench structure includes a via structure at a bottom of the trench structure, and an inner surface of the via structure is covered by the second barrier film but not by the first barrier film. In an example, the via structure reaches an embedded power rail.

In an example, the silicide layer of the exposed S/D structure includes a layer of titanium, titanium silicide, nickel, nickel silicide, platinum, platinum silicide, ruthenium, or ruthenium silicide. The dielectric materials surrounding the trench structure include one of silicon oxide, silicon nitride, or silicon carbon nitride (SiCN). The semiconductor device is a complementary field-effect transistor (CFET).

Aspects of the disclosure can further provide another semiconductor device. The semiconductor device can include a first S/D structure of a first FET and a first interconnect structure in contact with the first S/D structure. The first S/D structure includes a silicide layer in a first portion of a surface of the first S/D structure. The silicide layer can be in contact with an interface between the first S/D structure and the first interconnect structure. The first S/D structure includes a contact etch stop layer (CESL) in a second portion of the surface of the first S/D structure. The CESL does not exist in the first portion of the surface of the first S/D structure.

In an example, the semiconductor device can further include a first embedded power rail. The first interconnect structure includes a first via interconnect structure connecting the first interconnect structure to the first embedded power rail. In an example, the semiconductor device can further include a second S/D structure of a second FET formed on top of the first FET, and a second interconnect structure in contact with the second S/D structure. The second interconnect structure includes a second via interconnect structure connecting the second interconnect structure to a second embedded power rail. The second via interconnect structure is in contact with the CESL of the first S/D structure. In an example, the silicide layer includes a layer of titanium (Ti), and the CESL includes a layer of silicon nitride (SiN). In an example, the semiconductor device is a CFET device.

Aspects of the disclosure further provide a method of manufacturing a semiconductor device. The method can include forming a first S/D structure that includes epitaxy and a CESL covering the epitaxy; forming a pre-metal deposition (PMD) to embed the first S/D structure; forming a local interconnect trench and a first via at a bottom of the local interconnect trench, a portion of the CESL of the first S/D structure being exposed in the local interconnect trench; removing the portion of the CESL of the first S/D structure that is exposed in the local interconnect trench to expose the epitaxy of the first S/D structure; forming a silicide layer on top of the exposed epitaxy; and filling the local interconnect trench and the first via with a conductive material to form a first interconnect structure for the first S/D structure. The first interconnect structure can be in contact with the silicide layer.

In an embodiment, the local interconnect trench and the first via are formed by performing a dual damascene process. In an embodiment, the first via connects the first interconnect structure to a first embedded power rail. In an embodiment, the method further include forming a second interconnect structure for a second S/D structure that is stacked on top of the first S/D structure. The second interconnect structure includes a second via that connects the second interconnect structure to a second embedded power rail. The second via is in contact with the remaining CESL of the first S/D structure. In an embodiment, the silicide layer includes a layer of Ti, and the CESL includes a layer of SiN.

BRIEF DESCRIPTION OF THE DRAWINGS

Various embodiments of this disclosure that are proposed as examples will be described in detail with reference to the following figures, wherein like numerals reference like elements. It is noted that, in accordance with the standard practice in the industry, various features are not drawn to scale. In fact, the dimensions of the various features may be arbitrarily increased or reduced for clarity of discussion.

DETAILED DESCRIPTION OF EMBODIMENTS

Figure 1:
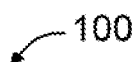
FIG. 1 shows the result of an incorporation of an atomic layer deposition of a barrier metal in a complementary field-effect transistor (CFET) device 100.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Techniques for monolithic and sequential transistor-on-transistor stacking of devices have been proposed for continuing device scaling through integration into three dimensions as conventional scaling methods, such as contacted-poly-pitch (CPP) (or transistor pitch) and metal pitch (routing track) reduction, are reaching their fundamental limits. Some devices fabricated with these new approaches are referred to as complimentary field-effect transistor (CFET) devices.

In the monolithic gate-on-gate stacking integrations, the complementary devices are formed sequentially, one over the top of the other within a single monolithic wafer. For example, the appropriate source and drain epitaxy can be formed, followed by the silicide formation and local interconnect metallization. Subsequently, the replacement metal gate process is performed in which common and/or split gates can be formed. In the sequential gate-on-gate stacking integrations, for example, the bottom device is formed through source and drain epitaxy, silicide formation, bottom device local interconnect metallization, and bottom device replacement metal gate integration. Then, a new wafer containing, for example, the nanosheet stack for the upper device can be placed on top of the bottom device. The same process as described for the bottom device can then be performed. For example, the upper source and drain epitaxy is formed; the silicide is formed; the upper interconnect metallization is performed; and finally, the upper replacement gate formation and connection to make any common gates can be performed.

From a device integration perspective, both monolithic and sequential approaches to 3D integration encounter challenges in terms of thermal processing.

In existing device manufacturing processes, such as FinFET, lateral gate-all-around, or nanosheet processes, the integration flows can be constructed such that processes requiring high temperatures are done predominantly in the front-end-of-the-line (FEOL). Such an integration flow can avoid disrupting materials (such as silicides or gate work function metals (WFMs)) which have physical limitations to these temperatures (such as recrystallization or agglomeration). Changes to the work function metals during thermal processing can change the threshold voltage of the device. Agglomeration of metals such as the silicide can cause significant voiding and physical breakdown of the film, leading to an inadequate connection between the respective contact and the interconnect metal. In addition, integrations flows with high temperature processing performed at the FEOL can minimize the diffusion of materials (such as dopants within the source and drain contacts) into metals.

As an example, a typical integration process of a FinFET device can include the following high thermal processing steps: (a) Anneal of the flowable oxide used to create the shallow-trench isolation. For example, the anneal can be performed at temperatures exceeding 1000° C. In some examples, nanosheet processing is performed. To prevent Ge diffusion from the SiGe/Silicon lattice in the initial fin structures, the processing temperature can be reduced down to below 900° C. (b) Pre-clean of the silicon tin prior to source and drain epitaxy deposition, which can be performed at temperatures of 700° C. to 780° C. (c) Formation of the NMOS source and drain utilizing in-situ doped silicon, which can be performed across a temperature range of 600-750° C. (d) Formation of the PMOS source and drain utilizing in-situ doped silicon germanium, which can be performed at temperatures between 525-650° C. (e) Reliability anneals of the high-k film in the high-k metal gate (HKMG) stack in order to drive out charge traps, which can be performed at temperatures between 700-780° C. (f) Source and drain dopant activation anneals for cases where implant is utilized for doping or co-doping the source and drain epitaxy, which typically can be performed with sub-millisecond processing at temperatures between 800-1000° C.

In a standard FinFET device integration process flow, the above higher temperature processes can be incorporated before the deposition of materials which are sensitive to higher temperatures. For example, in the replacement metal gate (RMG) process, many of these higher temperature processes can be done before the deposition of the work function metals.

Significant work has been done in the industry to lower many of these high-temperature processes in order to incorporate a wrap-around contact (WAC) device and in the eventual lead-up to three-dimensional devices. However, there are significant trade-offs with lowering the thermal processing temperature of many of these steps. Lowering the thermal processing temperature can potentially limit the device performance. For example, lowering the in-situ doped source and drain epitaxy growth for the contacts too far will lead to significantly lower levels of dopant within the source and drain regions. Likewise, reducing the temperatures of the reliability anneal can be done in conjunction with a high-pressure process in the presence of hydrogen. However, it is not well understood what the actual ramifications are to device performances in a scaled library.

For the case of monolithic CFET devices, as an example, a device integration flow can include the following processing steps: (a) NMOS source and drain epitaxy growth at temperatures between 600-700° C.; (b) NMOS silicide formation; (c) postal metal anneal at temperatures between 450-650° C.; (d) Silicon pre-clean at temperatures between 750-800° C.; (e) PMOS source and drain epitaxy growth at temperatures between 550-650° C.; (f) PMOS silicide formation; (g) Reliability anneal at temperatures between 700-780° C.; (h) source and drain activation at temperatures between 800-1100° C.; (i) Replacement metal gate work function metal depositions; and (j) M0 post-metal anneal (PMA) at a temperature of 450° C. For a sequential CFET device, the overall process will be similar, with the primary exception being that the RMG module will be done twice, one time after each local interconnect to the contact is formed and metalized.

In the case of the monolithic and sequential CFET integration process examples described above, the bottom device silicide is formed around the bottom device source and drain contact and then subsequently metalized by means of the formation of the lower local interconnect. This precedes the formation of the upper source and drain epitaxy (which again is typically done at high temperatures). It is feasible to replace the silicon pre-clean from a thermal process to a room-temperature vapor-phase etch process to remove the native oxide from the silicon or silicon germanium. The actual growth of the source and drain epitaxy is still required to be done at temperatures at or greater than 500° C. in some examples. Also, the epitaxy growth is done incorporating doping species such as boron or phosphorous and as such the saturation of the in-situ doped species is dependent upon the temperature of the epitaxy growth. For some embodiments of this disclosure, such an in-situ doped epitaxy process can exist at temperatures below the agglomeration temperature of the silicide which is typically on the order of 700° C.

One of the limitations of the source and drain epitaxy growth temperatures is the impact on the silicide and local interconnect metals that exist within the bottom device during the formation of the source and drain on the upper device. Local interconnect metals such as ruthenium (Ru) and other high refractive metals will be able to withstand temperatures up to 700° C. Commonly used silicide materials such as titanium (Ti) and nickel platinum will undergo agglomeration at these higher temperatures. This agglomeration of the metal can be seen both through a drastic change in sheet resistance as well as cross-sectional through STEM in an experiment.

In another experiment, a configuration of Si/Si:P/TiiN/Ru stack is provided where 40 Å of titanium is deposited over 400 Å of phosphorous doped silicon (7e20 cm-3 atomic concentration of phosphorous) with a thin TiN film (formed from the nitridation of the titanium deposition) and 30 Å of ruthenium metal. At lower temperatures such as 500° C., no agglomeration is observed. However, energy-dispersive X-ray spectroscopy (EDS) inspection shows the uptake of both silicon and phosphorous into the local interconnect metal.

The diffusion of silicon and phosphorous into the local interconnect metal can have a significant impact on contact and local interconnect resistance. A further concern is that excessive up-take of silicon into the local interconnect will significantly damage the source and drain contact and cause further contact resistance problems.

In order to mitigate the diffusion of silicon and dopants from the source and drain into the local interconnect metal, some type of barrier material can be employed. For example, barrier materials for this application can include conductive materials or metals, such as titanium nitride (TiN) and tantalum (TaN), and the like. Additional experiments show that such barrier films (or referred to as liner films) with a certain thickness, for example, on the order of 20 Å to 30 Å can mitigate the migration of silicon and phosphorous into the local interconnect metal at temperatures of around 500° C. with certain annealing time. Depending on the conditions of the specific applications, various barrier materials (other than TiN and TaN) can be employed, and various film thicknesses (other than that between 20 Å to 30 Å) can be adopted.

Generally, barrier materials such as TiN and TaN have low conductance compared with metals such as ruthenium or cobalt which are used for the local interconnect. This poses a significant issue for devices, particularly monolithic and sequential CFET devices, since the local interconnect can be formed together with the via connecting the interconnect down to the buried power rails. The formation of the local interconnect and the via, for example, can incorporate a process called dual damascene.

For example, a barrier metal (such as TiN) incorporated to be placed to minimize silicon and dopant diffusion from the source and drain contact into the interconnect metal can be deposited after the formation of the silicide. In some examples, when a dual damascene process is used, this would involve, for example, an atomic layer deposition of the barrier metal. The resulting barrier metal would not only conformally cover the surface of the silicide, but the inner surface area of the local interconnect, via connecting down to the buried power rail, as well as forming a conformal barrier at the interface between the via and the buried power rail. FIG. 1 shows the result of the incorporation of an atomic layer deposition of the barrier metal in a CFET device 100.

A sectional view crossing two source or drain (S/D) structures (or S/IDs) 112 and 122 of the CFET device 100 is shown in FIG. 1. The two S/D structures 112 and 122 can correspond to two transistors that are stacked up one over the other. For example, the upper transistor can be configured with nanosheet channels, while the lower transistor can be configured with a tin-structured channel.

For example, the top S/D 122 can be an NMOS S/D formed by a silicon epitaxy with phosphorus dopant (Si:P). The bottom S/D 112 can be a PMOS S/D formed by a silicon germanium epitaxy with boron dopant (SiGe:B). Each S/ID 112 or 122 can be covered with a silicide layer 113 or 123, respectively. For example, each silicide layer 113 or 123 can include a titanium (Ti) film at its outer surface.

A first interconnect structure 114 connects the bottom PMOS S/ID 112 to an embedded VDD power rail 110. A second interconnect structure 124 connects the upper NMOS S/D 122 to an embedded VSS power rail 120. The interconnect structures 114 and 124 and the power rails 110 and 120 can be formed with ruthenium, for example. Each interconnect structure 114 or 124 can have an upper portion (a local interconnect) and a lower portion (a via structure, or a via 111 or 121). As shown, the via 111 connects the upper portion (the local interconnect) of the interconnect structure 114 to the VDD power rail 110, while the via 121 connects the upper portion (the local interconnect) of the interconnect structure 124 to the VSS power rail 120. Each interconnect structure 114 or 124 can be capped with an etch stop layer 116 or 126, respectively.

Conformal barrier films 115 and 125 can be formed at the surface of each interconnect structure 114 and 124, respectively. In an example, the barrier films 115 and 125 can be made of titanium nitride (TIN). As shown, the barrier films 115 and 125 can occupy a space within the respective interconnect structure 114 or 124, which reduces the volumes of the ruthenium in the interconnect structures 114 and 124. When the thickness of the barrier films 115 and 125 increases, the volumes of the ruthenium in the interconnect structures 114 and 124 can decrease, leading to an increase of the resistance of each interconnect structure 114 or 124. In addition, as the barrier films 115 and 125 exist at the interfaces between the via 111 and the VDD power rail 110 and between the via 121 and the VSS power rail 120, an increase of the thickness of the barrier films 115 and 125 will also cause an increase of the resistance between each S/D structure 112 or 122 and the respective power rail 110 or 120.

As illustrated by the FIG. 1 example, the present inventors recognized that incorporating a barrier metal within the entirety of the local interconnect and via connecting down to power has a significant impact on resistance of the interconnect structures. The cumulative resistance as a function of a barrier thickness can significantly increase as the via is scaled down to a smaller size. In some examples, for the accumulation of resistances from a contact down to a buried rail, a resistance over 200 ohms would be considered detrimental to the performance of a device. Hence, while a barrier film can be employed to minimize the diffusion of silicon and dopants from the source and drain to the interconnect metal, the inventors discovered that the barrier only needs to be over the silicide layer and not within the entirety of the local interconnect and via structures.

Figure 2:
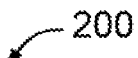
FIG. 2 shows a CFET device 200 resulting from a selective deposition process.
Figure 2:
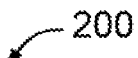

The present disclosure provides a method to selectively deposit the barrier metal only over the top of the silicide and not conformally across the entirety of the surface area of the local interconnect and via structure. FIG. 2 shows a CFET device 200 resulting from such a selective deposition method. The CFET device 200 in the FIG. 2 example has a similar structure to the CFET device 100 in the FIG. 1 example, except that two barrier films are formed in each interconnect structure instead of one: the barrier films 215a and 215b in the interconnect structure 214 replacing the barrier film 115 in FIG. 1, and the barrier films 225a and 225b in the interconnect structure 224 replacing the barrier film 125 in FIG. 1. Other elements 210-214, 216, 220-224, and 226 in FIG. 2 are similar to the elements 110-114, 116, 120-124, and 126 in FIG. 1.

In the CFET device 200, the barrier film 215a can-first be selectively formed first on top of the silicide layer 213 of the S/D structure 212 with a larger thickness (for example, in the range of 10-40 Å). The barrier film 215b can later be formed on the inner surface of the interconnect structure 214 (before the metallization of the interconnect structure 214) with a smaller thickness (for example, in the range of 2-5 A). The barrier film 215a can be thick enough for the purpose of minimizing the diffusion of silicon or dopants from the S/D structure 212. The barrier film 215b can be thin enough to minimize impact on the resistance of the interconnect structure 214 but thick enough for mitigating diffusion between an interconnect metal and surrounding dielectric materials. The barrier films 225a and 225b can be formed in a similar way to the barrier films 215a and 2156. The thicknesses provided above are merely examples and can be adjusted according to the specific process parameter configurations or desired device performance.

As described in the above example, the barrier metal in a selective deposition process would only be deposited over the top of the exposed surface of the silicide in the opened local interconnect structure and will not be deposited along the surface area of the entire local interconnect structure and via formed from, for example, a dual damascene process. Additionally, the selective deposition process will likewise not deposit any barrier metal at the interface between the buried power rail and the connecting via provided that the selective deposition process can be tuned specifically to the silicide.

In an experiment based on the CFET device 200, an improvement of the overall conductance associated with the removal of the barrier metal from the entirety of the local interconnect and via surfaces is demonstrated. Effectively, the via resistance improvement scales similarly with the removal of the barrier metal from its corresponding sidewall as if the via were scaled to be larger in size by the same amount, given the extreme differences in conductance between metals (such as ruthenium and cobalt) and barrier materials (such as TiN and TaN).

In some embodiments, barrier metal films can be made of TiN, TaN, and the like. Silicide materials can be titanium, titanium silicide, nickel, nickel silicide, platinum, platinum silicide, ruthenium, ruthenium silicide, and the like. Dielectric films, which would be inside the interconnect and via structures in a dual-damascene approach prior to metallization of the interconnect and via, can be some type of pre-metal dielectric such as silicon oxide, or dielectric liner materials such as silicon nitride, silicon carbon nitride (SiCN), or the like. Accordingly, the selective deposition of a barrier metal film over a silicide material can be selective to adopted dielectric films. In some examples, the selective deposition process can make a complete "seal" over the surface of a silicide in order to minimize diffusion of silicon, silicon germanium, or dopant species such as phosphorous, boron, arsenic, and the such from the source and drain region to the interconnect metal. In some examples, the selective deposition process can partially cover the surface of a silicide. A small-scale diffusion may take place but may not significantly affect the performance of CFET devices.

In an example embodiment, a self-assembled monolayer (SAM)-based area selective deposition is employed to form a diffusion barrier on top of a silicide layer. For example, a trench structure (or a trench) for containing the interconnect structure 214 can be formed through dielectric materials to expose the S/D 212. The silicide layer 213 can be formed over the S/D 212. A SAM layer can be formed to cover the inner surface of the interconnect structure 214 (that is the surface of the dielectric materials) but leaving the silicide layer 213 uncovered. Then, a deposition process (such as chemical vapor deposition (CVD) or atomic layer deposition (ALD)) can be performed to form the barrier film 215*a* over the silicide layer 213. Due to the SAM layer blocking the formation of the barrier film over the dielectric materials, the barrier film can be formed only over the silicide layer 213. The SAM layer can then be removed. The barrier film 215*b* can be conformally formed within the trench to cover the surface of the dielectric materials and the barrier film 215*a*. In other embodiments, selective deposition techniques other than the SAM-based method may be employed.

In some embodiments, the later formed barrier film 215*b* may not overlap the earlier formed barrier film 215*a*. For example, the barrier film 215*b* can only cover the surface of the dielectric materials surrounding the interconnect structure 214 by using a deposition process selective to the silicide layer 213. Depending on the selectivity of the deposition process, the barrier film 215*b* can cover or not cover the interface between the via structure 211 and the embedded power rail 210.

In some embodiments, the thick barrier film 215 can be formed over the inner surface of the upper portion (the local interconnect) of the interconnect structure 214. For example, the via structure 211 below the local interconnect can be covered up by filling a material or by a deposition of a film over the inner surface of the via 211. Then, the deposition of a first barrier film is performed within the trench of the interconnect structure 214. Then, the inner surface of the via 211 can be exposed. A second barrier film can be deposited over the entire inner surface of the trench. Because the upper portion of the interconnect structure 214 may have a larger size (for example, a larger width or volume), the thick barrier film 215*a* may have a limited impact to the conductance of the whole interconnect structure 214.

In some embodiments, the barrier films 215*a* and 215*b* may use different materials and thus may provide different diffusion protection properties. Considering the cost, process condition parameter configurations, properties of the silicide layer and the dielectric materials, the usage of different barrier film materials can provide more flexibility.

Aspects of the disclosure further provide a method of selective deposition of contact etch stop layer (CESL) to promote interconnect structure vertical self-alignment for stacked logic devices such as logic CFET devices. For example, as the sizes of CFET logic cells are being scaled down, the interconnect structures (such as via-to-rail structures and via-to-contact (VCT) structures) can come into close proximity to complementary devices. Some mechanisms for interconnect structure vertical self-alignment to reduce the possibility of shorting between the via structures and the complementary devices are desired. One solution is to thicken the CESL liner. However, simply increasing a thickness of the CESL without selective deposition would significantly drive contact resistance to a point where CFET devices would not make any sense for expected performance (such as power, performance, and area (PPA)).

The present disclosure provides a CESL selective deposition mechanism for facilitating interconnect structure vertical self-alignment where shorting between the via structures and the complementary devices can be reduced or prevented. For example, a thick CESL can be selectively deposited over a part of the surface of an S/D structure to prevent shorting to adjacent a via structure. The thick CESL would not be formed over the interface between the S/D structure and the respective local interconnect and thus would not affect the S/ID contact conductivity.

FIGS. 3-8 show a self-aligned metallization process for forming interconnect structures in a CFET device 300.

Perspective view (FIG. 3) or sectional views (FIGS. 4-8) of a sequence of intermediate stages of fabricating the CFET device 300 are illustrated. A section cut through a set of S/D structures is shown in each of the FIGS. 3-8. During the self-aligned metalization process, a CESL is selectively arranged over the surface of an S/D contact (SID structure) to help prevent shorting and to reduce local interconnect resistance.

Figure 3:
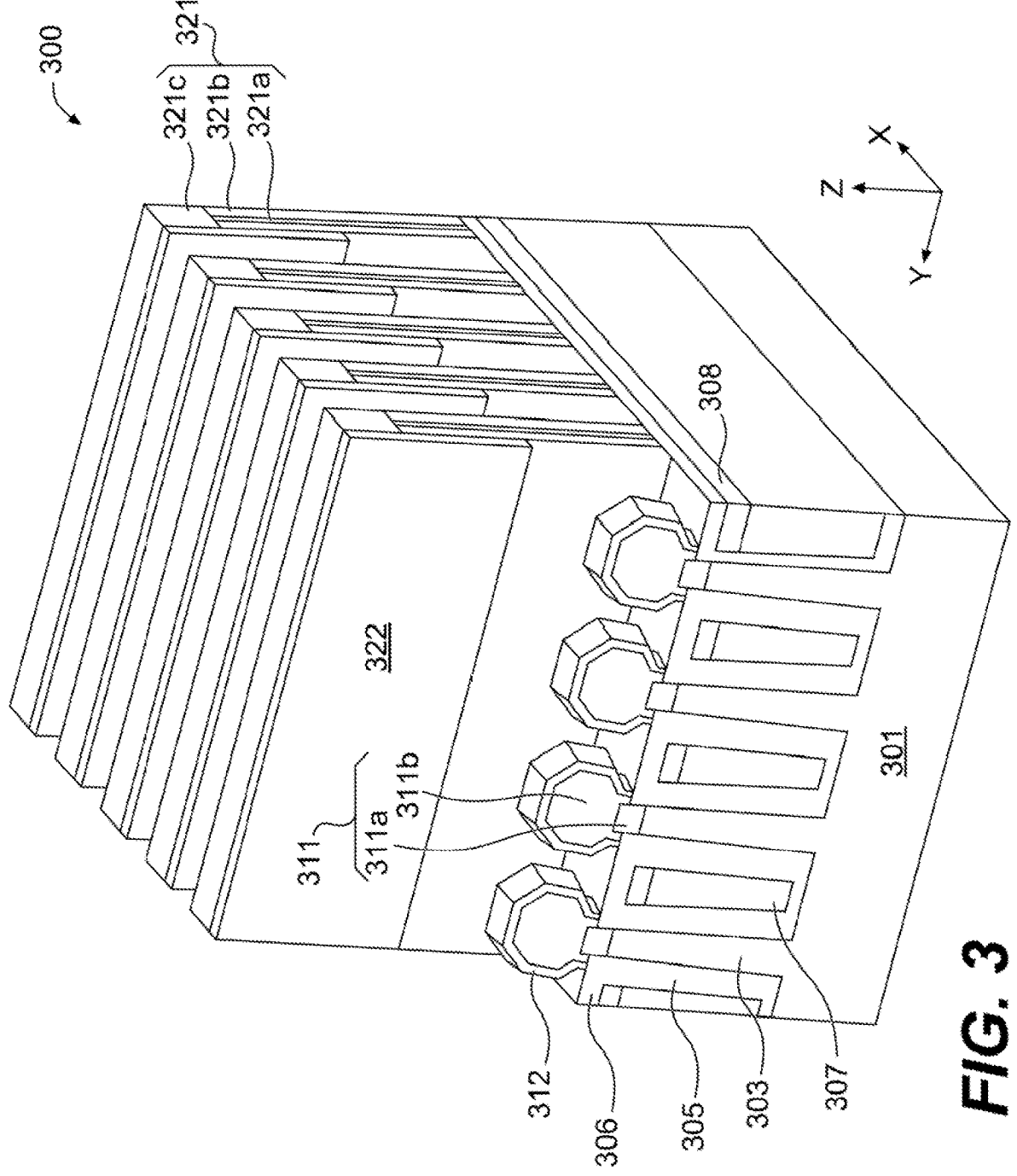
FIGS. 3-8 show a self-aligned metallization process for forming interconnect structures in a CFET device 300.

In FIG. 3, silicon fin structures 303 are formed over a silicon substrate 301. Power rails 307 are embedded in shallow trench isolation (STI) silicon oxide 305 between the fin structures. Each power rail 307 can be made of ruthenium (Ru) and covered by a cap layer 308, such as a layer of silicon carbide (SiC). An etch stop layer 306 (for example, silicon oxide) can be deposited from top to seal the power rails 307. A group of gate structures 321 cross the fin structures 303. Each gate structure 321 can comprise a pair of gate spacers 321*b* sandwiching a dummy gate 321*a* with a cap 321*c* overtop the gate spacers 321*b* and the dummy gate 321*a*.

The CFET device 300 can include two tiers of FET transistors stacked up in the vertical direction with respect to the substrate 301. For example, the lower tier of FET transistors can have fin-structured channels (that are an extending part of the fin structures 303 and not shown) between the respective pair of gate spacers 321*b* and embedded in the respective dummy gate 321*a*. The upper tier of FET transistors can have nanosheet channels between the respective pair of gate spacers 321*b*. As an example, the lower tier of FET transistors can be p-type FET while the upper tier of FET transistors can be n-type FET. It is noted that the architecture of the CFET device 300 is arbitrary. The disclosure is not limited to any specific CFET device architectures.

In the FIG. 3 example, bottom PMOS S/D structures 311 of the p-type FET are formed over the fin structures 303 in the space between neighboring gate structures 321. For example, the bottom S/D structures 311 can be epitaxially grown and can have a lower portion 311*a* of SiGe and an upper portion 311*b* of SiGe:B. A contact etch stop layer (CESL) 312 (silicon nitride (SiN), for example) can be selectively deposited over the surface of the bottom S/D structures 311. This CESL 312 can have a desired thickness that is effective to protect the S/D structures 311 from being shorted to metal interconnects formed during a following self-aligned metallization process. An NMOS cover spacer 322 can be formed over an upper portion of each sidewall of the gate spacer 321*b* to protect the upper nanosheet channels (not shown) when the lower tier of FET devices are being fabricated.

Figure 4:
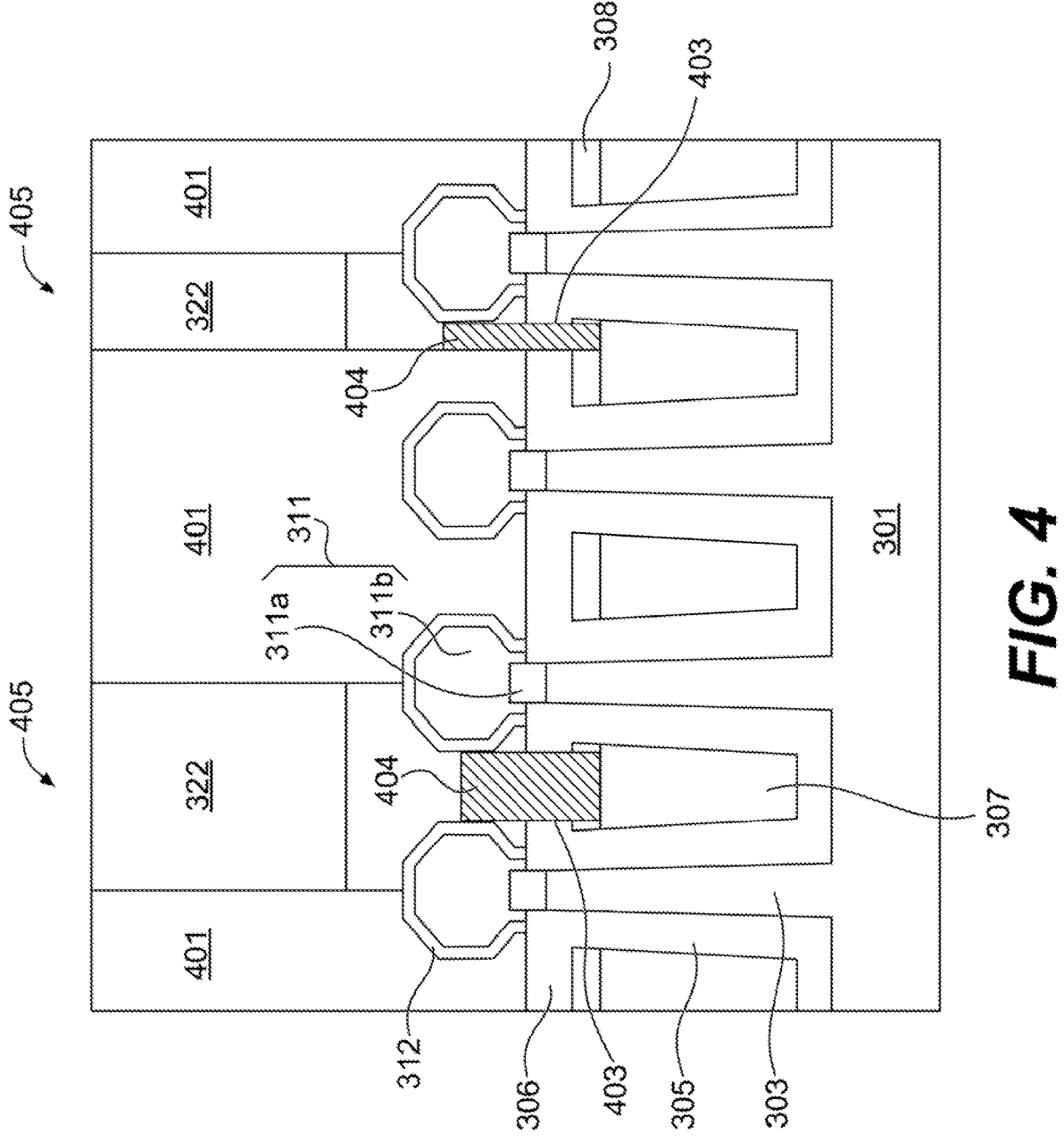

In FIG. 4, a dual damascene process is performed to form via structures 403 and local interconnect trenches 405 for subsequent metallization. As a particular example, a sacrificial light absorbing material (SLAM)-assisted dual damascene process is used. For example, a pre-metal deposition (PMD) silicon oxide (PMD oxide) 401 can first be filled in the trenches between the gate structures 321 to embed the S/ID structures 311. Then, via structures (or vias) can be formed through the PMD oxide 401 from top to down to reach the top surfaces of the power rails 307 by performing a first etch process (not shown). The cap layers 308 can be broken through to form the via structures. The substrate can then be coated with SLAM (the via structures can be filled with SLAM) and patterned with a trench photoresist. Then, a second etch process can be performed to etch down the PMD oxide 401 as well as the SLAM filled in the via structures (not shown). As a result, the trenches 405 can be formed with the vias 403 positioned below the respective trenches, and the S/D structures 311 are exposed. As shown, SLAM 404 remains at the bottom of the original via structures (now labeled as the via structures 403).

Figure 5:
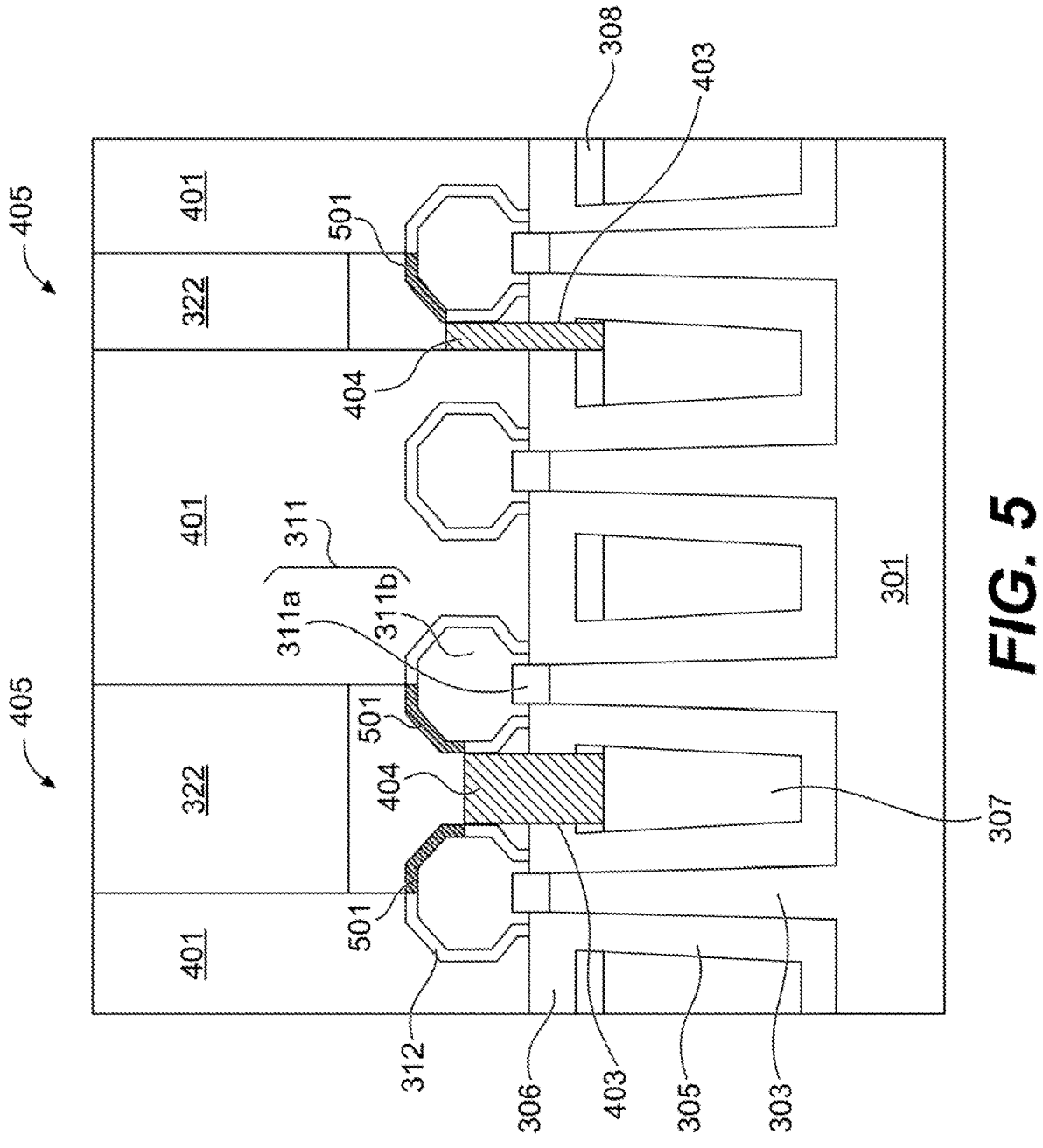

In FIG. 5, silicide layers (or silicide) 501 can be formed on the surface of the S/D structures (or S/D contact) 311. For example, the exposed portion of the CESL 312 of each S/D structure 311 can be removed to expose the epitaxy of the respective S/D structure 311. As a result, the remaining CESL 312 now only exists on a part of the surface of the respective S/D structure 311 and is embedded in the PMD oxide 401, forming the selective deposition of the CESL 312.

The silicide 501 can be formed over the surface of the exposed epitaxy of the respective S/D structure 311. In an example, to form the silicide 501, a film of titanium (Ti) can be selectively formed over the exposed epitaxy. A silicide-formation annealing can be performed to form the silicide compound of the silicide 501. After the annealing process, a layer of titanium can remain on the surface of the silicide 501 in some examples. Other metals can be used in place of titanium in various embodiments, such as aluminum, copper, tungsten, tantalum, ruthenium, cobalt, and the like.

Figure 6:
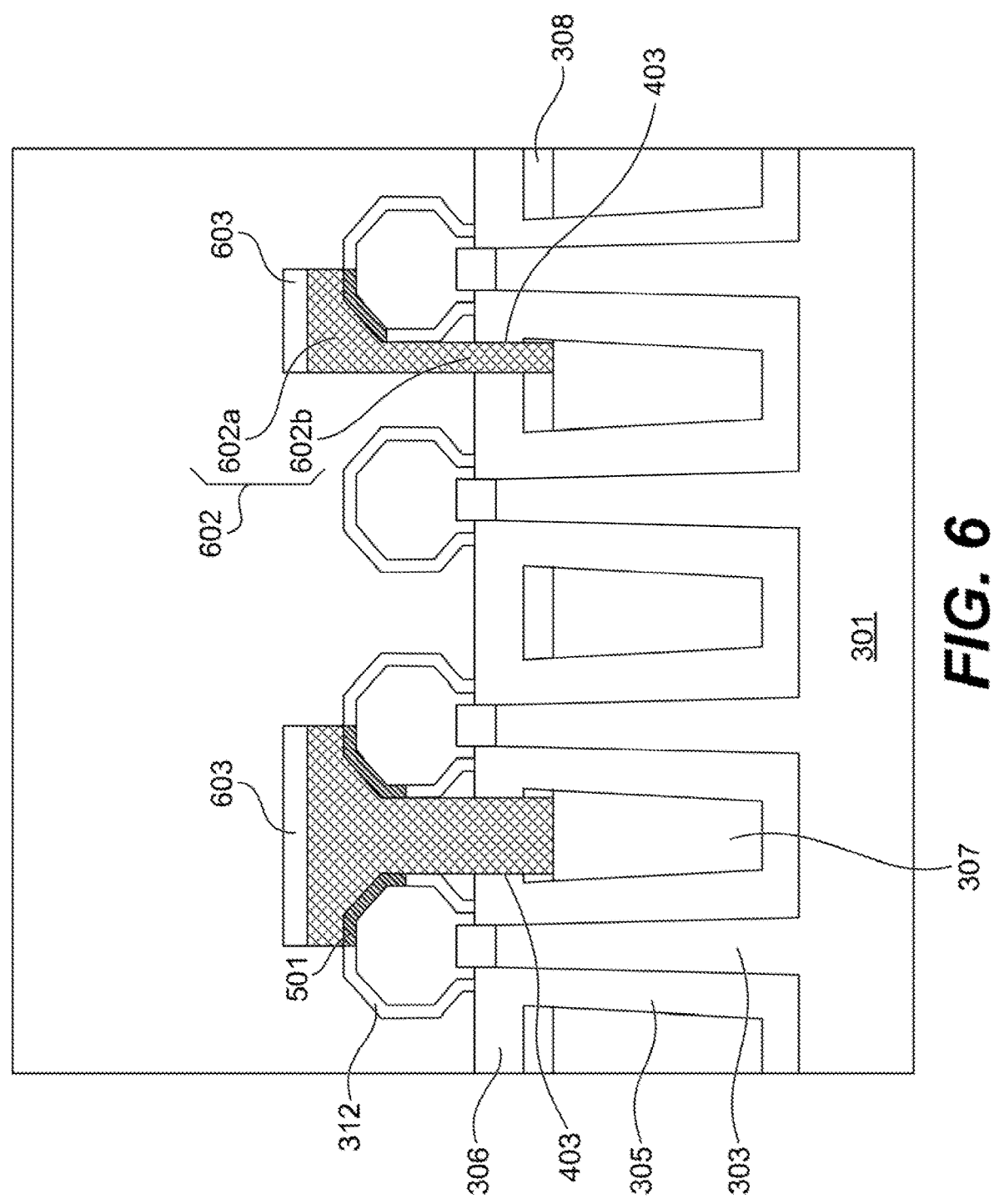

In FIG. 6, bottom interconnect metalization is performed to form interconnect structures 602. For example, the residual SLAM 404 can be removed from the vias 403. A barrier film or liner (now shown) can be formed over the inner surface of the vias 403 and the trenches 405. In some embodiments, the two-step deposition technique disclosed herein can be employed to form the barrier film or liner. For example, a first SAM-assisted selective deposition can be performed to selectively form a first barrier film (for example, TiN) over the respective silicide layer 501. Then, a second non-selective deposition can be performed to form a second barrier film over the inner surface of the trench and via structure. As a result of this two-step deposition, the resistance of the interconnect structures can be reduced and diffusion from the S/D structure to interconnect metal can be minimized. In some embodiments, the two-step deposition technique is not used. A one-step deposition, such as a CVD or ALD process, can be performed to form a barrier film.

Subsequently, a conductive material (such as ruthenium) can be filled into the trenches 405 and the vias 403 followed by a recess process to lower the top surface of the conductive material to a desired level. As a result, a local interconnect 602a and a via interconnect 602b can be formed as an upper portion and a lower portion of the respective interconnect structure 602. A cap layer 603 can be formed over the interconnect structure 602 followed by deposition of PMD oxide to seal the interconnect structure.

Figure 7:
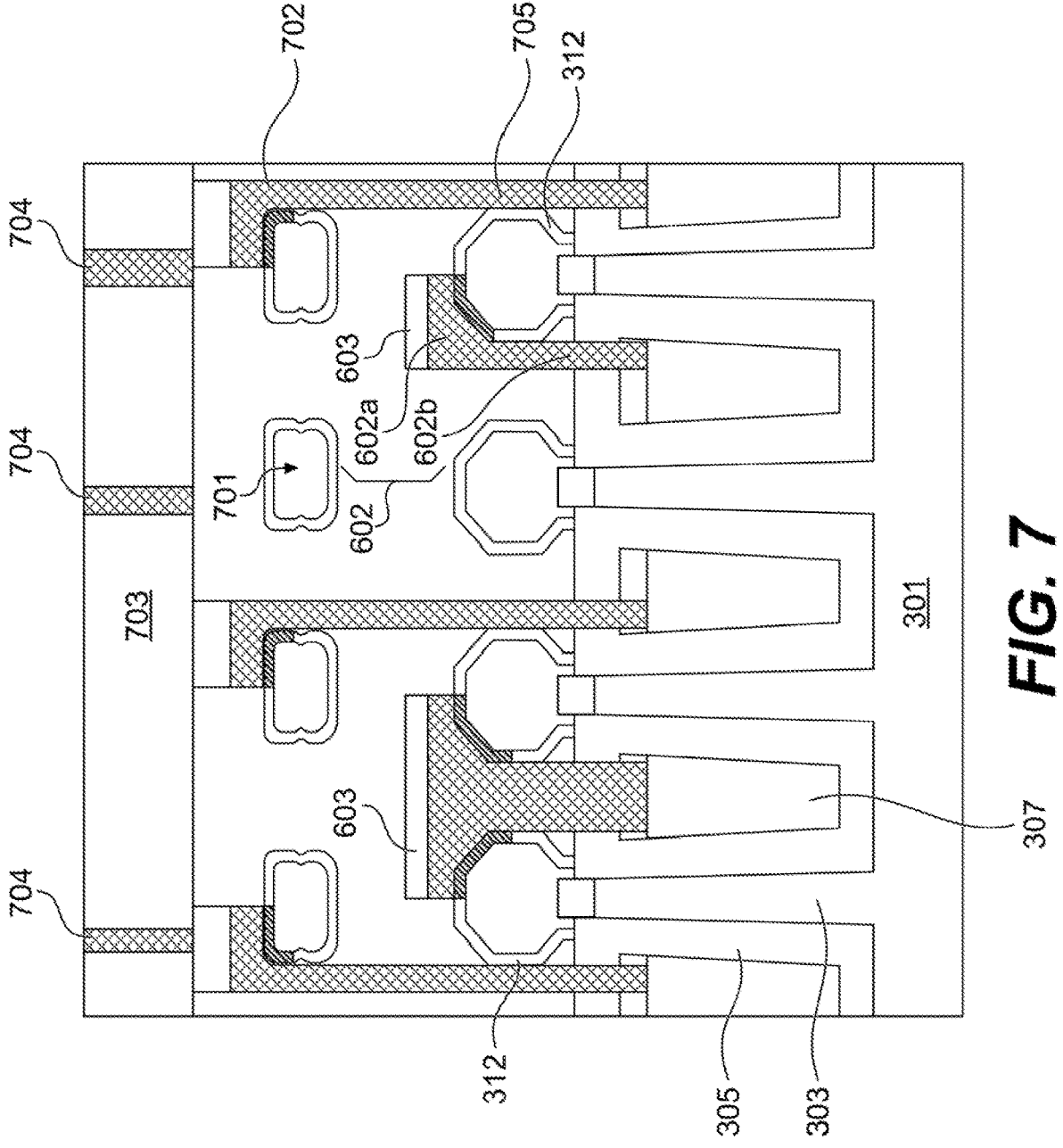

In FIG. 7, upper S/D structures 701 and upper interconnect structures 702 are formed followed by formation of metal layer 1 (M1). For example, the PMD oxide above the bottom S/D structures 311 can be recessed. The NMOS cover spacers 322 can be removed to expose the channels of the upper-tier FET devices. The upper S/D structures 701 can be epitaxially grown. After that, the processes similar to those for forming the lower interconnect structures 602 can be carried out to form the upper interconnect structures 702. For example, the processes can include deposition of CESL over S/D contacts, local interconnect trench and via formation, silicide formation, two-step barrier liner formation, and upper interconnect metalization.

After the formation of the upper interconnect structures 702, a gate replacement process can be performed to replace the dummy gates 321a with actual gate structures. After formation of the actual gate structures, a metalization of M1 can be performed. For example, following deposition of an etch stop layer on top of the substrate, a blanket of a dielectric layer 703 can be formed over the etch stop layer and planarized. Vias and trenches can be formed through the dielectric layer 703, the etch stop layer, and/or the PMD oxide and filled with a conductive material (such as tungsten, copper, aluminium, ruthenium, and the like) to form the M1 interconnect structures 704.

As shown, via structures 705, which connect the respective upper S/D structures 701 to the respective embedded power rails 307, are in close proximity to several bottom S/D structures 311. The selectively arranged CESL 312 can thus serve as an insulation layer to effectively prevent shorting between the S/D and the via interconnect. In various embodiments, the CESL 312 can be configured to have a predefined thickness that is effective in protecting the S/D structures from shorting to neighboring interconnect structures.

Figure 8:
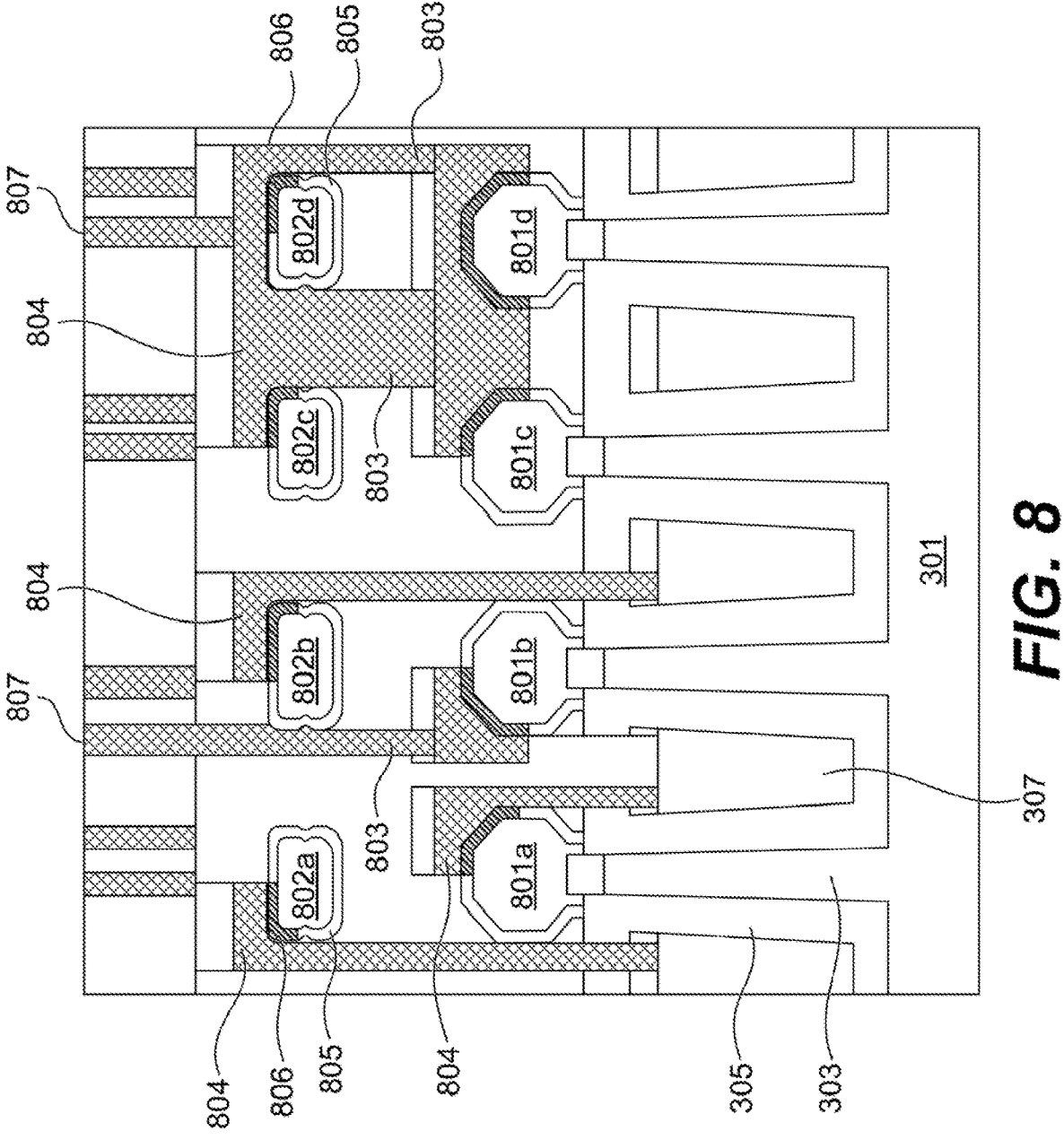

FIG. 8 shows a section of the same CFET device 300 made across a different set of S/D structures than those shown in FIGS. 3-7. Similarly, there are two tiers of FET devices: the lower tier of p-type FETs with fin-shaped channels and the upper tier of n-type FETs with nanosheet channels. Correspondingly, there exist bottom S/D structures 801a-801d and upper S/D structure 802a-802d each having respective interconnect structure 804.

Similar to the FIG. 7 example, a CESL 805 is formed selectively over a portion of the surface of the respective one of the S/D structures 801a-801d and 802a-802d. On top of the portion of the surface of each S/D structure not covered by the CESL, a silicide layer 806 is formed and is in connection with the respective interconnect structure 804. A barrier liner may be formed between the silicide layer 806 and the respective interconnect structure 804.

Different from the S/D structures 311 and 701 shown in FIG. 7, a first group of S/D structures 801a. 802a, and 802b are connected down to the embedded power rails 307, while a second group of S/D structures 801b-801d and 802c-802d are connected up to M1 interconnect structures 807 through via structures 803. In addition, the S/D structures 801c-801d and 802c-802d are connected together through respective local interconnects and via structures.

It is noted that the techniques of selective deposition of a barrier film or an etch stop layer disclosed herein are not limited to the devices described in this disclosure. For example, the techniques can be applied in various semiconductor devices that may have an architecture other than that of a CFET. For example, the various semiconductor devices can include, but not limited to, planar devices comprising FinFET, nanosheet FET, nano-wire FET, and the like; 3D devices comprising FinFET, nanosheet FET, nano-wire FET, and the like; and junction-based or junction-less transistors. In addition, the materials of the barrier films/liners, local interconnect structures, via structures, silicide, S/ID structures, CESL dielectric materials, caps, metals, etch stop layers, and the like, can vary in various embodiments of the present disclosure. The inventive concepts disclosed herein are not limited to the materials described in the present disclosure.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A semiconductor device, comprising:
a field-effect transistor (FET) having a source/drain (S/D) structure that includes a silicide layer surrounding an entire surface of the S/D structure; and
an interconnect structure in contact with the S/D structure, wherein
the interconnect structure has a barrier film at a surface of the interconnect structure separating the interconnect structure from materials surrounding the interconnect structure,
a first portion of the barrier film covers a first interface between the interconnect structure and a portion of the silicide layer of the S/D structure, a second portion of the barrier film covers a second interface between the interconnect structure and dielectric materials adjacent to the interconnect structure,
the first portion of the barrier film is thicker than the second portion of the barrier film, and
the first portion of the barrier film does not contain a material of the second portion of the barrier film.

2. The semiconductor device of claim 1, wherein the second portion of the barrier film covers a surface of a via structure of the interconnect structure.

3. The semiconductor device of claim 2, wherein the via structure connects the interconnect structure to a power rail.

4. A semiconductor device, comprising:
a first source/drain (S/D) structure of a first field-effect transistor (FET); and
a first interconnect structure in contact with the first S/D structure, wherein
the first S/D structure includes a silicide layer in a first portion of a surface of the first S/D structure, the silicide layer in contact with an interface between the first S/D structure and the first interconnect structure, and
the first S/D structure includes a contact etch stop layer (CESL) in direct contact with a second portion of the surface of the first S/D structure, the CESL not existing in the first portion of the surface of the first S/D structure,
wherein the silicide layer and the CESL cover the entire surface of the first S/D structure.

5. The semiconductor device of claim 4, further comprising:
a first embedded power rail, wherein
the first interconnect structure includes a first via interconnect structure connecting the first interconnect structure to the first embedded power rail.

6. The semiconductor device of claim 5, further comprising:
a second S/D structure of a second FET formed on top of the first FET; and
a second interconnect structure in contact with the second S/D structure, wherein
the second interconnect structure includes a second via interconnect structure connecting the second interconnect structure to a second embedded power rail, and
the second via interconnect structure is in contact with the CESL of the first S/D structure.

7. The semiconductor device of claim 4, wherein the silicide layer includes a layer of titanium (Ti), and the CESL includes a layer of silicon nitride (SIN).

8. The semiconductor device of claim 4, wherein the semiconductor device is a complementary FET (CFET) device.

* * * * *